(12) United States Patent
Jang et al.

(10) Patent No.: US 6,413,853 B2
(45) Date of Patent: Jul. 2, 2002

(54) METHOD OF FORMING A TUNGSTEN PLUG IN A SEMICONDUCTOR DEVICE

(75) Inventors: Seong-Dai Jang, Suwon; Jin-Ho Choi, Seoul, both of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/754,267

(22) Filed: Jan. 5, 2001

(30) Foreign Application Priority Data

Jan. 6, 2000 (KR) ........................................ 2000-00495

(51) Int. Cl.$^7$ .......................................... H01L 21/4763
(52) U.S. Cl. ........................ 438/627; 438/653; 438/656; 438/626
(58) Field of Search ................................ 438/627, 626, 438/625, 653, 656

(56) References Cited

U.S. PATENT DOCUMENTS

| | | | | |
|---|---|---|---|---|
| 4,994,410 A | * | 2/1991 | Sun et al. | 438/649 |
| 5,552,339 A | * | 9/1996 | Hsieh | 438/625 |
| 5,627,543 A | * | 5/1997 | Chang et al. | 438/627 |
| 5,994,775 A | * | 11/1999 | Zhao et al. | 257/751 |
| 6,180,506 B1 | * | 1/2001 | Sullivan | 438/618 |
| 6,207,558 B1 | * | 3/2001 | Singhvi et al. | 438/648 |
| 6,260,266 B1 | * | 7/2001 | Tamaki | 29/852 |
| 6,294,462 B1 | * | 9/2001 | Rha | 438/641 |

* cited by examiner

Primary Examiner—Carl Whitehead, Jr.
Assistant Examiner—Volita Russell
(74) Attorney, Agent, or Firm—Volentine Francos, PLLC

(57) ABSTRACT

A method of forming a tungsten plug in a semiconductor device includes forming a contact hole in an insulating layer, forming a contiguous titanium layer in the contact hole and on the insulating layer, forming a titanium nitride layer on the titanium layer. forming a thin tungsten layer of about 50 angstroms or less on the titanium nitride layer by CVD (chemical vapor deposition), annealing the structure once the thin tungsten layer has been formed, and depositing additional tungsten by CVD to completely fill the contact hole. The titanium nitride layer can be formed by a discrete CVD process or as a result of the annealing process. Forming a thin tungsten layer by CVD before the contact hole is completely filled in with tungsten is used to stabilize the titanium layer. For instance, a small amount of fluorine from the source gas of the thin tungsten layer diffuses into the titanium layer. Annealing the structure then diffuses the fluorine uniformly throughout the titanium layer to the point where additional fluorine from the subsequent CVD process of depositing tungsten can not diffuse into the titanium layer This, in turn, prevents a reaction at the titanium layer from taking place at the time the contact hole is filled in completely with tungsten. Accordingly, the titanium nitride layer remains adhered to the insulating layer.

7 Claims, 3 Drawing Sheets

METHOD OF FORMING A TUNGSTEN PLUG IN A SEMICONDUCTOR DEVICE

BACKGROUND OF THE INVENTION

1. Field of the Invention

The present invention relates to a method of fabricating a semiconductor device. More particularly, the present invention relates to a method of forming a tungsten plug in a semiconductor device.

This is a counterpart of, and claims priority to, Korean patent application no. 2000-00495, filed Jan. 6, 2000.

2. Description of the Related Art

As the circuitry of semiconductor devices become more highly integrated, the area occupied by a semiconductor element and a wiring line of the devices become smaller and smaller. Currently, a three-dimensional semiconductor element arrangement and a multi-level wiring technique are widely used to produce a high degree of integration within a limited area. In this case, contact holes in various interlayers of the device are used to facilitate a large number of contacts between the semiconductor element and the wiring line or between discrete wiring lines. Given that the contact holes will have a certain depth dictated by the vertical dimension of the interlayer, contact holes having a greater aspect ratio are required. However, it is very difficult to form contact holes having a high aspect ratio. That is, it is very difficult to etch a thick interlayer insulating layer and form a deep and narrow contact hole. In addition, it is difficult to completely fill a deep and narrow contact hole with conductive material that is used to produce the contact.

More specifically, the electrical contact for connecting an electrode element and a wiring line in a semiconductor device is typically formed when metal is deposited on an interlayer insulating layer having a contact hole therein. For instance, when metal is deposited on an interlayer insulating layer to form the wiring line itself, the contact hole in the interlayer insulating layer is also filled with the metal thereby connecting the wiring line, as it is formed, to the electrode element. Aluminum is widely used for the wiring line due to its excellent electrical characteristics. Furthermore, because aluminum has a low melting point, the aluminum once deposited is subjected to a reflow process so that it will completely fill the narrow and deep contact hole without giving rise to a so-called over-hang phenomenon or without any void being left in the contact. Even more specifically, first, aluminum is sputtered into the contact hole and then heat is applied to reflow the aluminum, whereby the contact hole is completely filled with the aluminum. In general, more aluminum is sputtered after the reflow process has been performed. However, when deposited aluminum is directly in contact with an underlying silicon substrate (e.g., a source/drain) exposed by the contact hole, silicon diffuses into the aluminum due to its high solubility, even at a low temperature. Hence, the aluminum spikes into the silicon, leading to source/drain junction leakage. In order to prevent such an aluminum spiking phenomenon from occurring, a barrier metal layer is formed on the silicon before the aluminum is deposited.

It has also been known to use an Si-Al alloy as the target material in sputtering for reducing the silicon diffusion that otherwise occurs when pure aluminum is sputtered into a contact hole exposing a silicon layer. Because Si-Al exhibits a stable solid state, no further diffusion of silicon from the substrate into the aluminum occurs after Si-Al alloy is sputtered onto the silicon substrate, thereby preventing the aluminum spiking phenomenon from occurring.

Nonetheless, the higher the integration density of the integrated circuit and the greater the aspect ratio of the contact hole become, the sputtering process obviously becomes more and more problematic. Accordingly, the process of sputtering aluminum to form a contact in a contact hole is being reduced in favor of a CVD (chemical vapor deposition) process of forming a tungsten plug in the contact hole. Tungsten deposited by CVD has excellent filling characteristics. The CVD of tungsten uses $WF_6$, $SiH_4$ or $H_2$ as a source gas and the basic chemistry thereof is as follows.

[Equation 1]

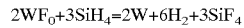
$$2WF_6+3SiH_4=2W+6H_2+3SiF_4$$

[Equation 2]

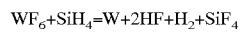
$$WF_6+SiH_4=W+2HF+H_2+SiF_4$$

[Equation 3]

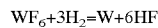
$$WF_6+3H_2=W+6HF$$

Many different methods of CVD, i.e. methods carried out under various process conditions, have been suggested as being capable of efficiently forming CVD tungsten having an excellent contact hole filling characteristic. Nonetheless, like the case of using aluminum to form an electrical contact in a contact hole, the use of CVD tungsten also requires the forming of a barrier metal layer to prevent silicon from diffusing into the metal contact. In this case, titanium and titanium nitride layers are sequentially formed over the silicon layer (source/drain region). The titanium layer serves as a so-called ohmic contact to provide a good contact resistance. The titanium nitride layer serves as a main barrier layer. The titanium nitride layer also prevents $WF_6$ from diffusing into and hence, reacting with the titanium layer. The basic chemistry associated with the reaction of $WF_6$ and titanium is as follows.

[Equation 4]

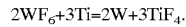
$$2WF_6+3Ti=2W+3TiF_4.$$

If there is any defect in the titanium nitride layer, or if the titanium nitride layer is not properly stuffed with oxygen, then $WF_6$ can penetrate through weak spots of the titanium nitride layer and react with the underlying titanium. FIGS. 1 and 2 show the problems associated with an imperfect titanium nitride layer when a CVD tungsten plug is used as a contact. Sputtered titanium nitride layer 400 undergoes high stress. The stress is most concentrated at a corner of the silicon layer 200 defining the opening of the contact hole. Because of the columnar growth of titanium nitride layer 400, the material at the corner is also more porous and thus more vulnerable to $WF_6$ penetration. Once started, the reaction between the titanium layer 300 and the $WF_6$ proceeds rapidly. As a result, the titanium nitride layer 400 peels off of the silicon layer 200 as shown in FIG. 1. Meanwhile, tungsten nucleates on both sides of the peeling titanium nitride layer 400 and grows into thick tungsten films, forming a rather pronounced hump or conical protrusion 510 as shown in FIG. 2. Therefore, the etchback RIE process cannot remove the hump or conical protrusion 510 completely resulting in intra-and inter-level metal shorts.

Attempts to prevent such a hump or protrusion from being produced can be made. For instance, the corner of the silicon layer 200, defining the opening of the contact hole, can be provided with curvature to reduce the stress concentration on the titanium nitride layer 400. Also, the sputtering processing conditions and annealing process under which the titanium nitride layer 400 is formed can be carefully controlled to limit the porosity and maximize the density of the titanium nitride. However, providing the corner of the silicon layer 200 with curvature at the opening of the contact hole compromises the degree to which the device can be made more densely integrated. In addition, it is difficult to precisely control the forming (composition) and annealing of the titanium nitride. Accordingly, it is difficult to completely prevent the titanium nitride layer 400 from peeling off of the silicon layer 200 and hence, it is difficult to keep the hump or protrusion 510 from forming.

Many methods have in fact been suggested as being capable of preventing the so-called volcano phenomena, shown in FIG. 2, from occurring. U.S. Pat. No. 5,552,339 discloses a method in which an amorphous silicon layer is formed on an adhesive layer. U.S. Pat. No. 5,874,355 claims to produce a highly dense titanium nitride layer by introducing nitride plasma during the annealing process. U.S. Pat. No. 5,672,543 discloses the use of a buffer layer for reducing the stress on the titanium nitride layer. However, all of these methods require a large number of process steps or strict controls on the execution of steps performed in addition to those of the basic prior art method described above.

SUMMARY OF THE INVENTION

It is an object of the present invention to provide a method of forming a tungsten contact plug in a manner that prevents a barrier metal layer from peeling and hence that prevents the occurrence of a tungsten volcano phenomenon.

In order to achieve this object, the present invention provides a method of forming a tungsten contact plug which method includes steps of forming a contact hole in an insulating layer, forming a titanium layer contiguously in the contact hole and on the insulating layer, forming a titanium nitride layer on the titanium layer, forming a thin tungsten layer of about 50 angstroms or less on the titanium nitride layer by CVD (chemical vapor deposition), annealing the structure comprising the thin tungsten layer, and depositing tungsten thereon by CVD to completely fill the contact hole.

During the step of forming the thin tungsten layer, fluorine ($F_2$) from tungsten source gas $WF_6$ diffuses into the titanium layer via the titanium nitride layer. However, only a limited amount of the fluorine diffuses into the titanium layer because only a thin layer of the tungsten is being formed. The subsequent annealing process gives rise to further diffusion among elements of the silicon layer and barrier metal layers. In any case, the fluorine is now dispersed uniformly throughout the titanium layer. Because compounds such as $TiF_4$ and $F_2$ exist within the titanium layer, the titanium layer assumes the state of a chemically stable solid body.

Now, if a certain material has a predetermined solid solubility with respect to a solid material layer, the introduction of an additional amount of the certain material does not create an additional reaction. Under this principle, the $F_2$ generated during the step of filling the contact hole with tungsten has difficulty diffusing into the titanium layer. That is, the present invention intentionally reacts a minimum amount of fluorine with the titanium layer to disperse just enough fluorine throughout entire titanium layer so that the above-described phenomenon of solid solubility comes into play during the CVD process of depositing tungsten to completely fill in the contact hole. At that time, the fluorine can not react with the titanium layer to a degree that affects the barrier characteristics of the titanium nitride layer.

BRIEF DESCRIPTION OF THE DRAWINGS

These and other objects, features and advantages of the present invention will be better understood by referring to the following detailed description of the preferred embodiments thereof made with reference to the accompanying drawings, of which.

DETAILED DESCRIPTION OF THE PREFERRED EMBODIMENTS

Figure 1:
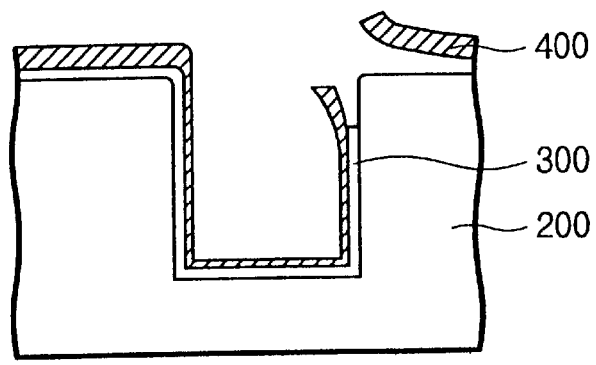
FIG. 1 is a cross-sectional view of a semiconductor substrate, showing a titanium nitride layer peeling off of its substrate according to the prior art.
Figure 2:
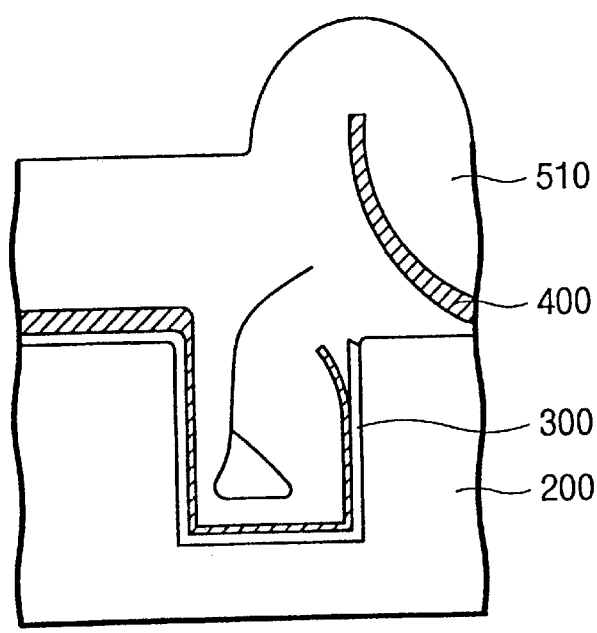
FIG. 2 is a similar cross-sectional view of the semiconductor, showing the formation of a tungsten hump or protrusion according to the prior art.
Figure 3:
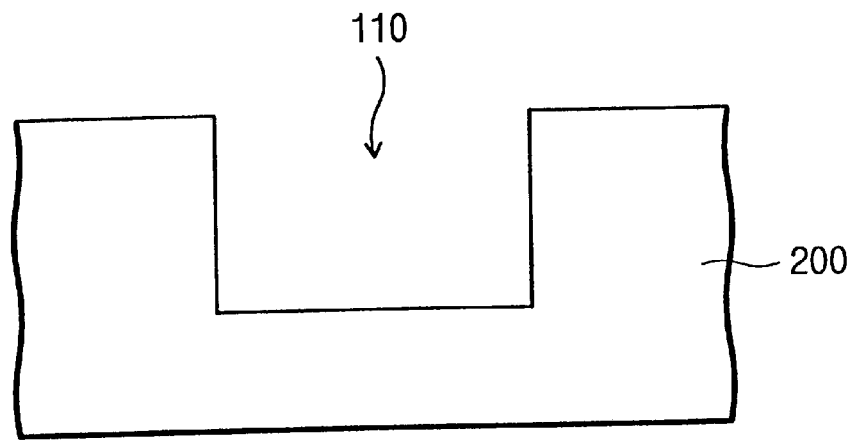
FIGS. 3 to 6 are cross-sectional views of a semiconductor substrate at selected stages, respectively, of a method of forming a tungsten contact plug according to the present invention.

The present invention will now be described more fully hereinafter with reference to FIGS. 3 to 6, in which the preferred embodiment of the invention is shown. Referring first to FIG. 3, a contact hole 110 is formed in an interlayer insulating layer 200. Although not shown, the contact hole 110 exposes a lower conductive layer. The interlayer insulating layer 200 is formed of an oxide by chemical vapor deposition (CVD). The technique of forming the interlayer insulating layer 200 and the contact hole 110 is well known in the art per se and a more detailed explanation thereof is omitted for the sake of brevity.

Figure 4:
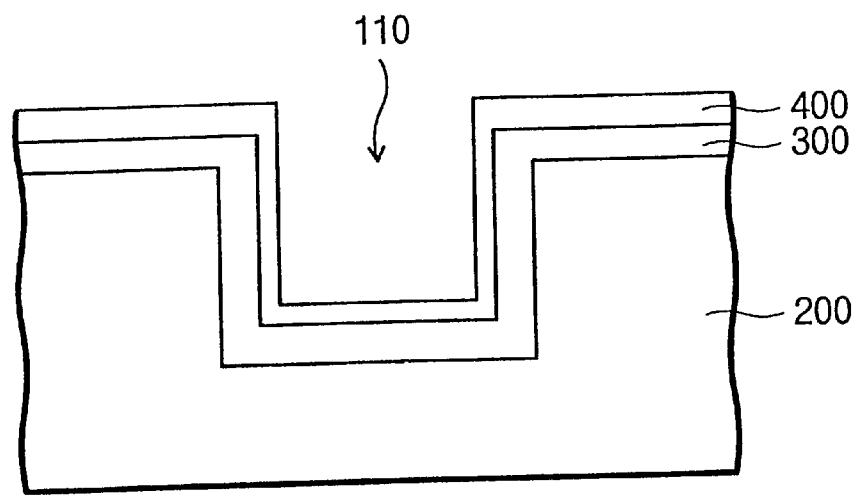

Next, as is shown in FIG. 4, a barrier metal layer, including a titanium layer 300 and a titanium nitride layer 400, is formed on the insulating layer 200 and in the contact hole in conformity therewith. That is, the profile of the barrier metal layer corresponds to the profile of that portion of the surface of the insulating layer 200 in which the contact hole is formed. The titanium layer 300 is formed to a thickness of about 100–200 angstroms on the interlayer insulating layer 200 and in the contact hole 110 by CVD. The titanium nitride layer 400 is formed to a thickness of about 100–200 angstroms on the titanium layer 300 by CVD, as well. For efficiency, the titanium layer 300 and the titanium nitride layer 400 are preferably formed in-situ in the same CVD apparatus by controlling the source gas introduced into a processing chamber of the apparatus. Note, a barrier metal layer formed by CVD is subject to less stress compared to one formed by sputtering. Therefore, a barrier metal layer formed by CVD is seen to exhibit less cracking after the device undergoes further processing.

Figure 5:
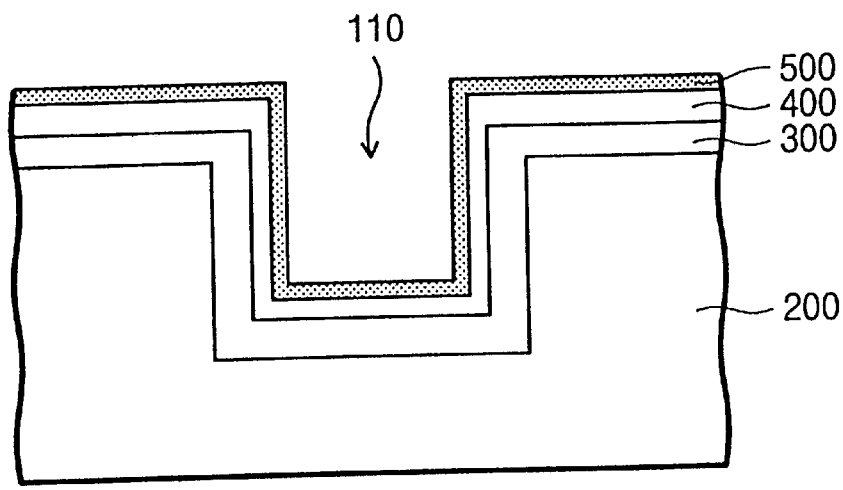

Referring now to FIG. 5, a thin CVD tungsten layer 500 is formed on the titanium nitride layer 400 in conformity therewith. That is, the profile of the thin CVD tungsten layer 500 corresponds to the profile of the underlying titanium nitride layer 400. The thin CVD tungsten layer 500 is formed to a thickness of about 50 angstroms or less, and preferably to a thickness of 20 to 30 angstroms. In this CVD process, tungsten source gas $WF_6$ reacts with $SiH_4$ to cause tungsten to deposit on the titanium nitride layer 400. By-products of the reaction include HF, $SiF_4$, and $H_2$. Some of the $WF_6$ molecules penetrate the porous titanium nitride layer 400 and react with the titanium layer 300, thereby forming $TiF_4$. As a result, titanium, $TiF_4$ and unreacted $WF_6$ form a composite titanium layer.

After the thin CVD tungsten layer 500 is formed, the structure is annealed to form a silicide layer on the silicon substrate 200 and to increase the density of the titanium nitride layer 400 for increasing its barrier characteristics. The annealing process is carried out in an RTP (rapid thermal process) apparatus. The titanium can be annealed in one step at a temperature of about 750° C. or higher to react with silicon, to thereby form a titanium silicide layer that reduces contact resistance. Alternatively, the titanium can be first annealed at a temperature of about 600 to 750° C. for a predetermined period of time and then secondly annealed at a temperature of about 750° C. or higher for another predetermined period of time. Furthermore, high temperature annealing increases the kinetic energy, i.e., the velocity, of the components such as $TiF_4$ and fluorine. As a result, the $TiF_4$ and fluorine are distributed uniformly throughout the titanium layer 300.

Typically, the annealing is carried out in a nitride ambient or in an oxygen-containing ambient. In the case of a nitride ambient, the pores of the titanium nitride layer 400 are filled in thereby increasing the density of the titanium nitride layer 400. Hence, the ability of the titanium nitride layer 400 to prevent source gas from passing therethrough (barrier characteristic) is enhanced.

Moreover, if titanium is annealed in a nitride ambient, a layer of titanium nitride can be formed. Thus, the present invention can be carried out by first forming the titanium layer 300, and then annealing the resulting structure to produce the titanium nitride layer 400, i.e., without the discrete step of forming the titanium nitride layer by CVD.

Figure 6:
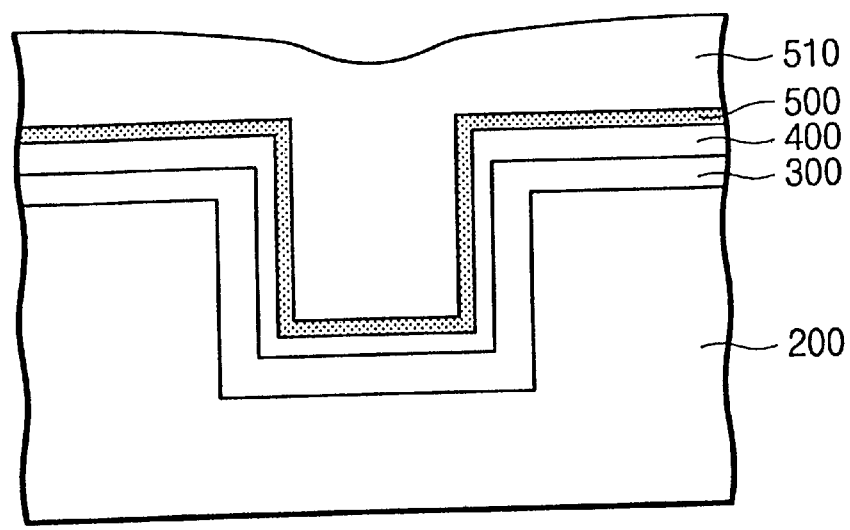

Referring now to FIG. 6, after the annealing is performed, a main tungsten layer 510 is formed on the resulting structure to fill in the contact hole and thus, form a contact plug. The tungsten layer 510 is formed to a thickness of about 3500 to 5000 angstroms. The main tungsten layer 510 is preferably formed in-situ in the same CVD apparatus used for forming the barrier metal layer. According to prior art, the titanium nitride layer is affected at the time of post-barrier metal deposition annealing and of tungsten plug formation, with the resulting being that $WF_6$ easily penetrates the titanium nitride. The $WF_6$ thus reacts with the titanium layer disposed beneath the titanium nitride layer. This reaction ultimately results in the peeling of the titanium nitride, and eventually manifests itself as the so-called tungsten volcano phenomenon.

However, in accordance with the present invention, the titanium layer 300 is formed as a stable solid body in which $TiF_4$ and fluorine are dissolved. Therefore, when the main tungsten layer is being formed, the additional $WF_6$ does not react with the titanium layer 300.

The deposited tungsten layer 510 is then planarized down to the interlayer insulating layer 200, whereby a tungsten plug is formed. Wiring material, such as aluminum, is then deposited on the interlayer insulating layer 200 and on the tungsten plug. Alternatively, the tungsten layer 510 can be patterned to form tungsten wiring.

Although the present invention has been described above with respect to the preferred embodiments thereof, various changes thereto and modifications thereof will become readily apparent to those of ordinary skill in the art. All such changes and modifications that fall within the scope of the appended claims are thus seen to be within the true spirit and scope of the present invention.

What is claimed is:

1. A method of forming a tungsten plug in a semiconductor device, said method comprising:

forming a contact hole in an insulating layer;

forming a titanium layer in the contact hole and on the insulating layer and which titanium layer has a profile conforming to the profile of a region of the surface of the insulating layer defining the contact hole;

forming a titanium nitride layer on the titanium layer and having a profile conforming to that of the titanium layer;

forming a tungsten layer having a thickness of about 50 angstroms or less on the titanium nitride layer by chemical vapor deposition (CVD), wherein a portion of the contact hole remains unfilled;

annealing the resulting structure comprising the tungsten layer; and subsequently depositing tungsten by CVD on the resulting structure comprising the thin tungsten layer to thereby fill in the contact hole completely.

2. The method according to claim 1, wherein said annealing of the thin tungsten layer is carried out in a nitride ambient at a temperature of about 750° C. or more.

3. The method according to claim 1, wherein said forming of the tungsten layer is carried out until the tungsten layer has a thickness of 20 to 30 angstroms.

4. The method according to claim 1, wherein the titanium nitride layer and the tungsten layer are formed in-situ.

5. A method of forming a tungsten plug in a semiconductor device said method comprising:

forming a contact hole in an insulating layer;

forming a titanium layer in the contact hole and on the insulating layer and which titanium layer has a profile conforming to the profile of a region of the surface of the insulating layer defining the contact hole, forming a tungsten layer having a thickness of about 50 angstroms or less directly on the titanium layer by chemical vapor deposition (CVD), wherein a portion of the contact hole remains unfilled;

annealing the resulting structure comprising the tungsten layer at a temperature that causes a layer of titanium nitride to form at the surface of the titanium layer; and subsequently depositing tungsten by CVD on the resulting structure comprising the tungsten layer to thereby fill in the contact hole completely.

6. The method according to claim 5, wherein said annealing of the thin tungsten layer is carried out in a nitride ambient at a temperature of about 750° C. or more.

7. The method according to claim 5, wherein said forming of the tungsten layer is carried out until the tungsten layer has a thickness of 20 to 30 angstroms.

* * * * *